US007715995B2

(12) United States Patent
Goodnow et al.

(10) Patent No.: US 7,715,995 B2
(45) Date of Patent: *May 11, 2010

(54) DESIGN STRUCTURE FOR MEASUREMENT OF POWER CONSUMPTION WITHIN AN INTEGRATED CIRCUIT

(75) Inventors: Kenneth Joseph Goodnow, Essex, VT (US); Clarence Rosser Ogilvie, Huntington, VT (US); Nitin Sharma, South Burlington, VT (US); Sebastian Theodore Ventrone, South Burlington, VT (US); Charles S. Woodruff, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 106 days.

This patent is subject to a terminal disclaimer.

(21) Appl. No.: 12/046,501

(22) Filed: Mar. 12, 2008

(65) Prior Publication Data
US 2009/0153324 A1 Jun. 18, 2009

Related U.S. Application Data

(63) Continuation-in-part of application No. 11/956,836, filed on Dec. 14, 2007.

(51) Int. Cl.
*G06F 19/00* (2006.01)

(52) U.S. Cl. .............................. 702/60; 702/61; 326/37; 326/68; 716/6; 716/7; 713/300; 713/320; 257/48; 711/118; 711/220

(58) Field of Classification Search ................... 702/60, 702/61; 326/33, 37, 38, 66, 68, 81; 716/1, 716/4, 5, 6, 7, 17; 713/300, 320; 257/48; 711/118, 220; 703/15, 18
See application file for complete search history.

(56) References Cited

U.S. PATENT DOCUMENTS

| 6,021,381 | A  | * | 2/2000 | Ohnishi ........................ 702/60 |
| 6,513,146 | B1 | * | 1/2003 | Yonezawa et al. ............... 716/7 |
| 6,566,909 | B2 | * | 5/2003 | Okumura ...................... 326/68 |
| 7,051,306 | B2 | * | 5/2006 | Hoberman et al. .............. 716/6 |

(Continued)

OTHER PUBLICATIONS

Notice of Allowance (Mail Date: Aug. 24, 2009) for U.S. Appl. No. 11/956,836, filed Dec. 14, 2007, Confirmation No. 8214.

*Primary Examiner*—Carol S Tsai
(74) *Attorney, Agent, or Firm*—Schmeiser, Olsen & Watts; Riyon W. Harding

(57) ABSTRACT

An design structure for measuring power consumed during operation of an integrated circuit. The design structure including: a data processing circuit having an input and an output, the data processing circuit configured to generate an output data signal on based on an input data signal; a power measurement circuit configured to measure an amount of electrical power consumed by the processing circuit in generating the output signal from the input signal, the power measurement circuit connected between the processing circuit and a power supply for the processing circuit; and a memory element configured to store a tag containing a value representing the amount of electrical power consumed by the processing circuit in generating the output data signal from the input data signal and either (a) the input data of the input data signal or (b) a pointer to the input data of the input data signal.

11 Claims, 4 Drawing Sheets

U.S. PATENT DOCUMENTS

| | | | |
|---|---|---|---|
| 7,343,276 B1* | 3/2008 | Tsukamoto et al. | 703/18 |
| 7,403,035 B1* | 7/2008 | Shumarayev et al. | 326/41 |
| 2001/0049588 A1* | 12/2001 | Bausch et al. | 702/107 |
| 2003/0088840 A1* | 5/2003 | Yonezawa et al. | 716/7 |
| 2005/0160391 A1* | 7/2005 | Orita | 716/13 |
| 2007/0101172 A1* | 5/2007 | Ohyama | 713/300 |
| 2007/0255928 A1* | 11/2007 | Fukai | 711/220 |
| 2008/0001634 A1* | 1/2008 | Arabi et al. | 326/99 |
| 2008/0184049 A1* | 7/2008 | Mathur et al. | 713/320 |
| 2008/0258765 A1* | 10/2008 | Shumarayev et al. | 326/41 |
| 2008/0276105 A1* | 11/2008 | Hoberman et al. | 713/300 |
| 2009/0057665 A1* | 3/2009 | Lou | 257/48 |

* cited by examiner

US 7,715,995 B2

DESIGN STRUCTURE FOR MEASUREMENT OF POWER CONSUMPTION WITHIN AN INTEGRATED CIRCUIT

The present application is a Continuation In Part of copending U.S. patent application Ser. No. 11/956,836 filed on Dec. 14, 2007.

FIELD OF THE INVENTION

The present invention relates to the field of integrated circuits; more specifically, it relates to circuits, methods, and design structures for measuring power consumption of integrated circuits.

BACKGROUND OF THE INVENTION

Mitigating power consumption is a requirement in modern integrated circuit design. Existing methods of power consumption mitigation are based on a proactive preventative type approach using, for example, lower power elements, sleep and power-down modes and voltage islands. However, the majority of non-clocked power in a digital design is data dependent. Since the data is usually not known ahead of time it is impossible to accurately predict the power consumption of integrated circuits using these aforementioned power consumption mitigation methods. Accordingly, there exists a need in the art to overcome the deficiencies and limitations described hereinabove.

SUMMARY OF THE INVENTION

A first aspect of the present invention is s design structure embodied in a machine readable medium, the design structure comprising: a data processing circuit having an input and an output, the data processing circuit configured to generate an output data signal on the output based on an input data signal presented to the input; a power measurement circuit configured to measure an amount of electrical power consumed by the processing circuit in generating the output signal from the input signal, the power measurement circuit connected between the processing circuit and a power supply for the processing circuit; and a memory element configured to store a tag containing a value representing the amount of electrical power consumed by the processing circuit in generating the output data signal from the input data signal and either (a) the input data of the input data signal or (b) a pointer to the input data of the input data signal.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The terms process data and power data are used to distinguish data that is logically processed by a logic circuit (process data) from data representing the power consumed by the logic circuit in processing the process data (power data). Input data, intermediate data and output data are cases of process data relative to the input and output of the processing circuit and stages within the processing circuit.

Figure 1:
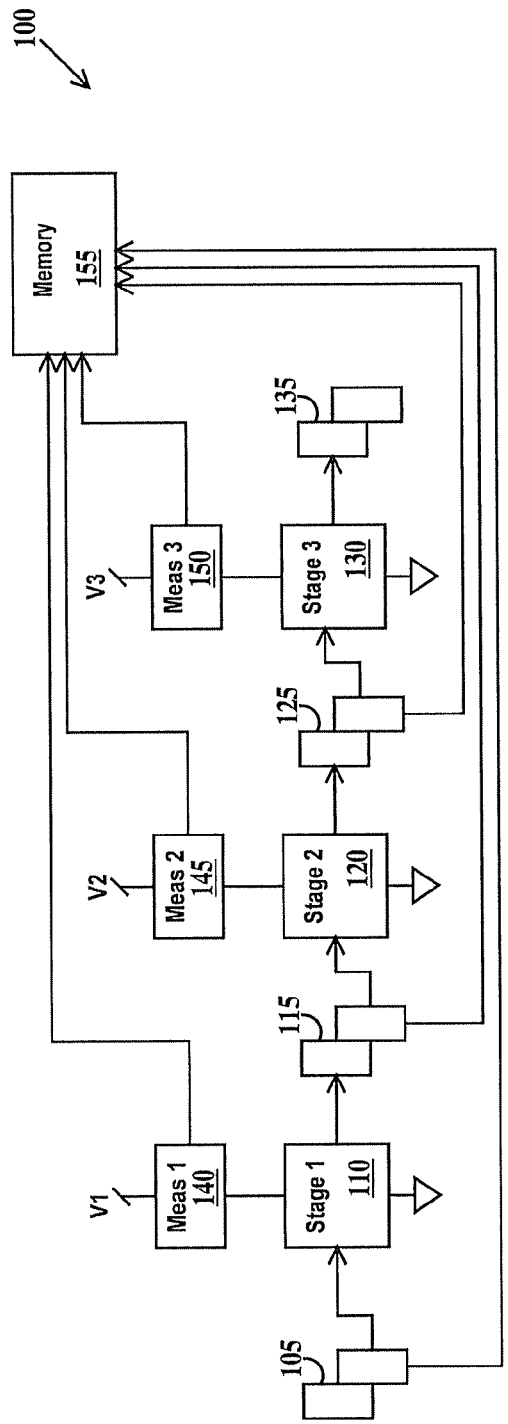
FIG. 1 is an exemplary circuit diagram of an integrated circuit according to a first embodiment the present invention.

FIG. 1 is an exemplary circuit diagram of an integrated circuit according to a first embodiment the present invention. In FIG. 1, an integrated circuit 100 includes an input latch 105, a first processing stage 110, a first intermediate latch 115, a second processing stage 120, a second intermediate latch 125, a third processing stage 130 and an output latch 135, all connected in series. Processing stages 110, 120 and 130 represent a processing circuit that is to be monitored for power consumption. While only three processing stage are illustrated in FIG. 1 and processing stages 110, 120 and 130 are shown in series so the output of data from processing stage 110 is the input data to processing stage 120 and the output of data from processing stage 120 is the input data to processing stage 130, there may be more or less processing stages and the logic cone may comprise series and parallel data paths. The input data signal presented on input latch 105 is digital data. Input latch 105 and output latch 135 may be replaced with internal pins (i.e., connections to other circuits) or I/O pads (i.e., off-chip connections). Internal latches 115 and 125 may be independently replaced with registers or eliminated so there are direct wire connections between processing stages 110, 120 and 130. Latches 105, 115, 125 and 135 may independently be latches in a serial chain of latches (e.g. a scan chain). Latches 105, 115, 125 and 125 may include logical functions. In one example, processing circuits 110, 120 and 130 include one or more logic gates. Examples of logic gates include AND gates, OR gates, NAND gates, NOR gates and multiplexers. Processing data is defined as performing a logical or arithmetic operation on the data. The operation may or may not change the data.

First processing stage 110 is supplied with a first power supply V1, second processing stage 120 is supplied with a second power supply V2 and third processing stage 130 is supplied with a third power supply V3. In one example, power supplies V1, V2 and V3 are independent power supplies and processing stages 110, 120 and 130 are voltage islands. A voltage island is defined as a region of an integrated circuit chip that is supplied power independently from and power-wise isolated from other regions of the integrated circuit chip. In one example, power supplies V1, V2 and V3 are independent buses from a common power supply. Connected between first processing stage 110 and power supply V1 is a first power measurement circuit 140. Connected between second processing stage 120 and power supply V2 is a second power measurement circuit 145. Connected between third processing stage 130 and power supply V3 is a third power measurement circuit 150. The respective outputs of each of measurement circuits 140, 145 and 150 are connected to a memory element 155. Respective outputs of each of latches circuits 105, 115 and 125 are also connected to memory element 155.

Each of measurement circuits 140, 145 and 150 are configured to measure the power consumed when input data is processed by respective processing stages 110, 120 and 130. Each of measurement circuits 140, 145 and 150 may independently measure power, for example, by (i) measuring voltage and current flow to processing stage and calculating power consumed, (ii) by measuring voltage drop across a shunt with known resistance which may be a wire in the power network or (iii) by measuring current if the voltage is constant. In one example, each of elements 140, 145 and 150 includes means for converting the power measurement into power data and for storing the power data in memory element 155. In one example, a data conversion circuit is coupled between each measurement circuit 140, 145 and 150 and memory element 155. The data (or a pointer to that data) that was input to each processing stage as the power consumption was measured is also stored in memory element 155 where the power data and process data are associated to each other. Note, the actual process data need not be stored but metadata may be stored. Metadata is a pointer to memory device and location in that device where the actual process data is stored. This requires logic functions within latches 105, 115 and 125 to generate the pointers and additional memory to store the process data. Memory element 155 maybe portioned into a tag section (described infra) and an actual process data section. Association may be, for example by order, timestamp or information contained in the process data or metadata.

In a multistage pipeline as illustrated in FIG. 1, each processing stage is generating power data simultaneously. In the following example, based on FIG. 1, association is by ordering. In Table I, process data (or metadata), processing stage that processed the process data, and calculated power consumption (or power data allowing calculation of power consumption) is associated with a Tag ID.

TABLE I

| TAG ID | PROCESS DATA | PROCESSING STAGE | POWER CONSUMED |
|---|---|---|---|
| 21 | A1 | 1 | 1.3 |
| 22 | B2 | 2 | 2.6 |
| 23 | C3 | 3 | 5.4 |
| 24 | D1 | 1 | 1.0 |
| 25 | A2 | 2 | 0.4 |
| 26 | B3 | 3 | 5.1 |

In TABLE II, the Tags (an entry in memory element 155) from TABLE I stored in memory as illustrated. Tags include the stage, process data and power data. Tag IDs are the order in which tags are stored. Using circuit 100 of FIG. 1, as process data is processed through the stages power consumption can be associated with each intermediate result. For example, input data stream A is input data A1 as input to stage 1, intermediate data A2 as input to stage 2 and intermediate data A3 as input to stage 3. Process data B is B1 as input to stage 1, B2 as input to stage 2 and B3 as input to stage 3.

TABLE II

1, A1, 1.3
2, B2, 2.6
3, C3, 5.4
1, D1, 1.0

TABLE II-continued

1, A2, 0.4
3, B3, 5.1
1, E1, 7.0
2, D2, 4.2
3, A3, 3.9

Returning to TABLE I, it can be seen that the data stream of data signal A (A1 to A2 to A3) is included in Tags 21 and 25 and is non-sequential. It is possible to order the tags before storing them so data streams are sequential. A data stream is defined as the process data from the input data signal to a processing circuit to the output data signal of the processing circuit including the intermediate data generated by stages within the processing circuit.

Figures 5, 6, 7, 8:
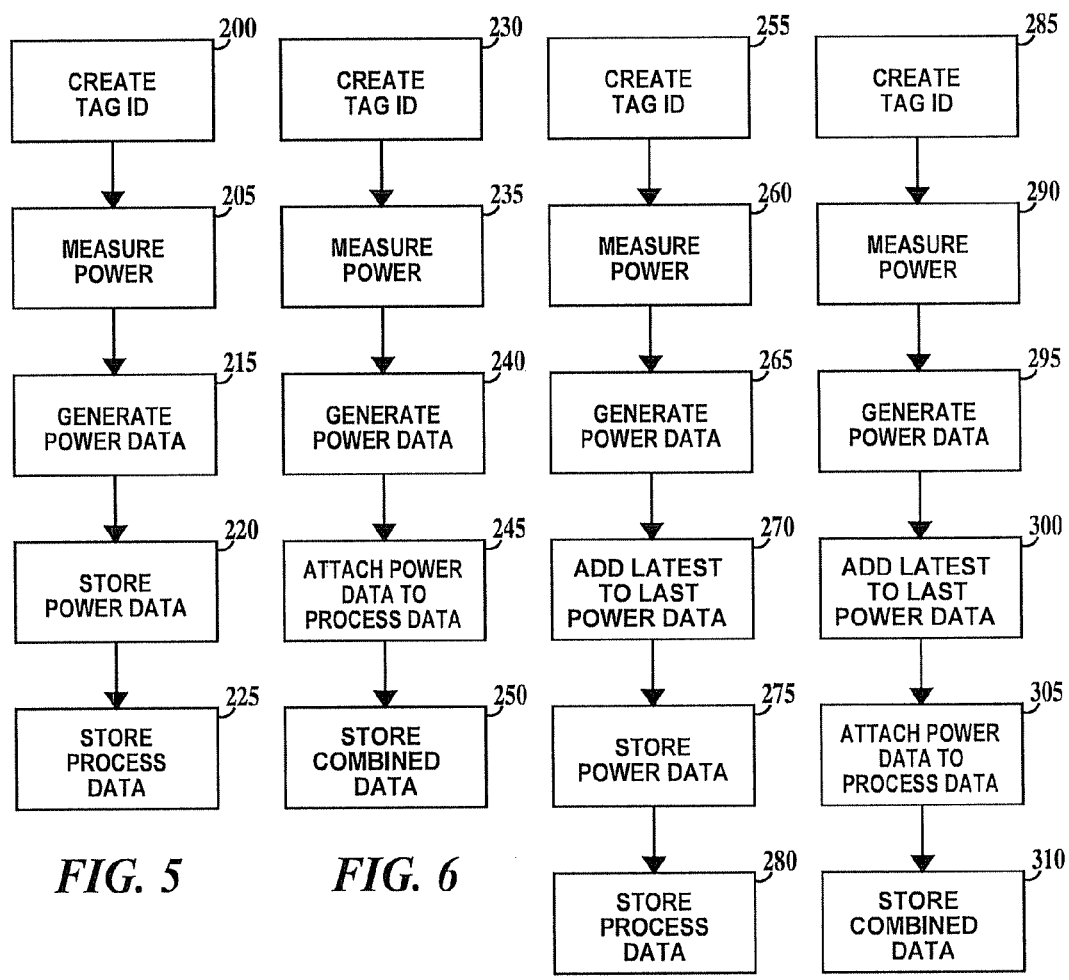
FIG. 5 is a flowchart of a first method according to the embodiments of the present invention.
FIG. 6 is a flowchart of a second method according to the embodiments of the present invention.
FIG. 7 is a flowchart of a third method according to the embodiments of the present invention.
FIG. 8 is a flowchart of a fourth method according to the embodiments of the present invention.

Turning to FIG. 5, FIG. 5 is a flowchart of a first method according to the embodiments of the present invention. Steps 200, 205, 215, 220 and 225 are performed for each processing stage independently. In step 200, a tag ID is created. In step 205, power consumption is measured and in step 215 power data is generated. In step 220, the power data is stored in memory and in step 225 the process data is stored in memory. The sequence that steps 200, 205, 215, 220 and 225 are performed in may vary depending upon the actual circuit implementation.

Figure 2:
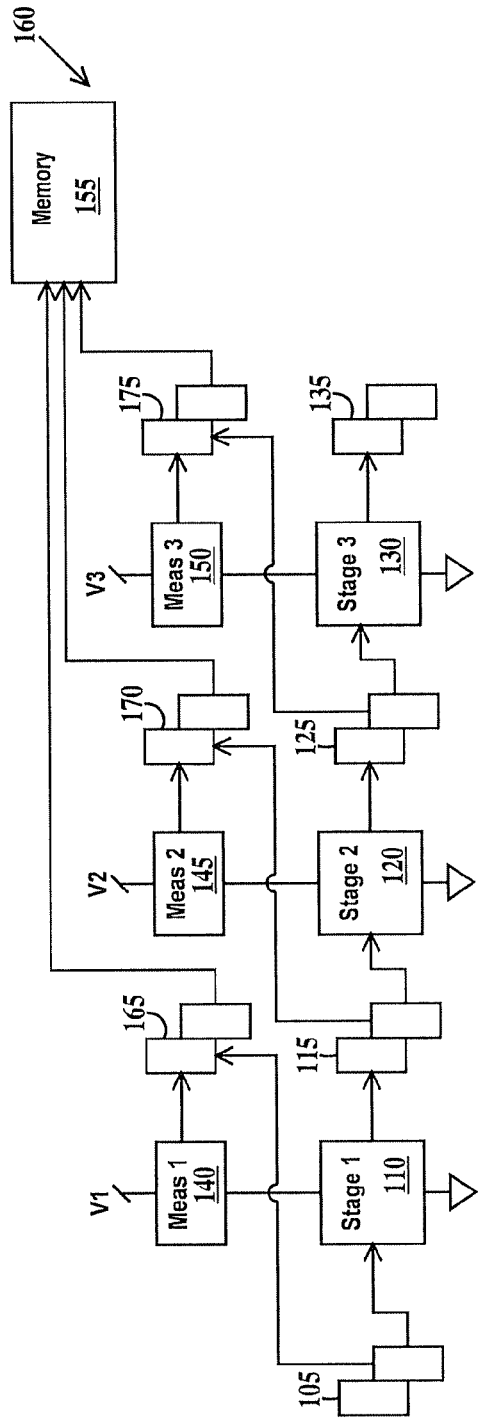
FIG. 2 is an exemplary circuit diagram of an integrated circuit according to a second embodiment the present invention.

FIG. 2 is an exemplary circuit diagram of an integrated circuit according to a second embodiment the present invention. In FIG. 2, an integrated circuit 160 is similar to integrated circuit 100 of FIG. 1 except latches (or registers or logic circuits) 165, 170 and 175 are included and instead of the respective outputs of each of measurement circuits 140, 145 and 150 being connected to memory element 155 they are connected to respective latches 165, 170 and 175 and latches 165, 170 and 175 are connected to memory element 155. Latches 165, 170 and 175 combine power data with process data (or metadata) before the data is sent to memory element 155. This simplifies wiring and generation and control of Tag IDs. The Tags are the same as those illustrated in TABLE II.

Turning to FIG. 6, FIG. 6 is a flowchart of a second method according to the embodiments of the present invention. Steps 230 through 250 are performed for each processing stage independently. In step 230, a tag ID is created. In step 235, power consumption is measure and in step 235 power data is generated. In step 240, the power data is attached to the process data in step 225 the combined power/process data is stored in memory. The sequence that steps 230, 235, 240, 245 and 250 are performed in may vary depending upon the actual circuit implementation except steps 235 and 240 are performed before step 245 and step 250 is performed after step 245.

Figure 3:
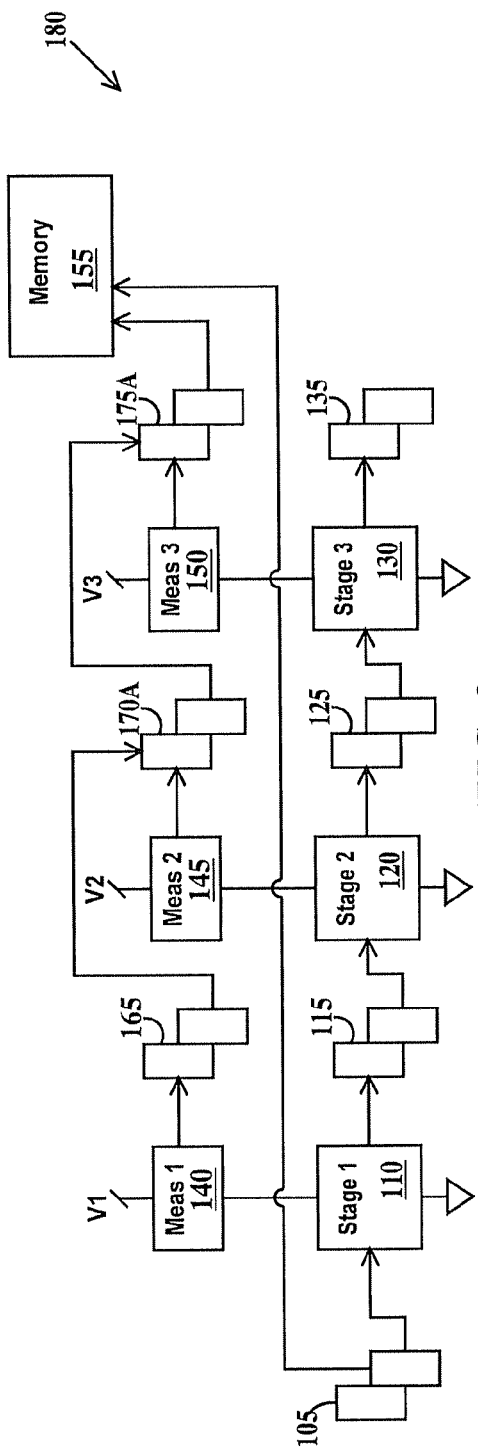
FIG. 3 is an exemplary circuit diagram of an integrated circuit according to a third embodiment the present invention.

FIG. 3 is an exemplary circuit diagram of an integrated circuit according to a third embodiment the present invention. In FIG. 3, an integrated circuit 180 is similar to integrated circuit 160 of FIG. 2 except latches 170A and 175A replace latches 170 and 175 respectively, input latch 105 is connected to memory element 155, there are no connections between latches 115 and 170A or latches 125 and 175A, and instead of each of latches 165, 170A and 175A being connected to memory element 155, only latch 175A is connected to memory unit 175A with latch 165 being connected to latch 170 and latch 170 being connected to latch 175A. Latch 170A includes logic to add the power measurement data from latch 165 to the power measurement data from measurement circuit 145 and store the sum. Latch 175A includes logic to add the power measurement data from latch 170A to the power measurement data from measurement circuit 150 and store the sum. This arrangement of latches allows the power measured by power measurement circuits 140, 145 and 150 to be added before being stored in memory unit 180 and the total power associated with processing a particular process data through all three stages. The Tags for integrated circuit 180 are illustrated in TABLE III. These tags do not include stage identifiers. Timed control of the process input sequence to latch 105 is required in order associate the input process data on latch 105 with the output power data on latch 175A properly. No new data can be inputted to latch 105 until data is outputted from latch 175A.

TABLE III

A, 6.5
B, 7.4
C, 5.4
D, 4.0

Turning to FIG. 7, FIG. 7 is a flowchart of a third method according to the embodiments of the present invention. Steps 255, 275 and 280 are performed for each new process data entering process stage 1. Steps 260, 265 and 270 are performed for each processing stage independently. In step 255, a tag ID is created. In step 260, power consumption is measure and in step 265 power data is generated. In step 270, for the second and third stages, the power data from the previous processing stage is added to the power data from the current processing stage. In step 275, the power data is stored in memory and in step 280 the process data is stored in memory. The sequence that steps 255, 260, 265, 270, 275 and 280 are performed in may vary depending upon the actual circuit implementation except steps 265 and 270 are performed before step 275.

Figure 4:
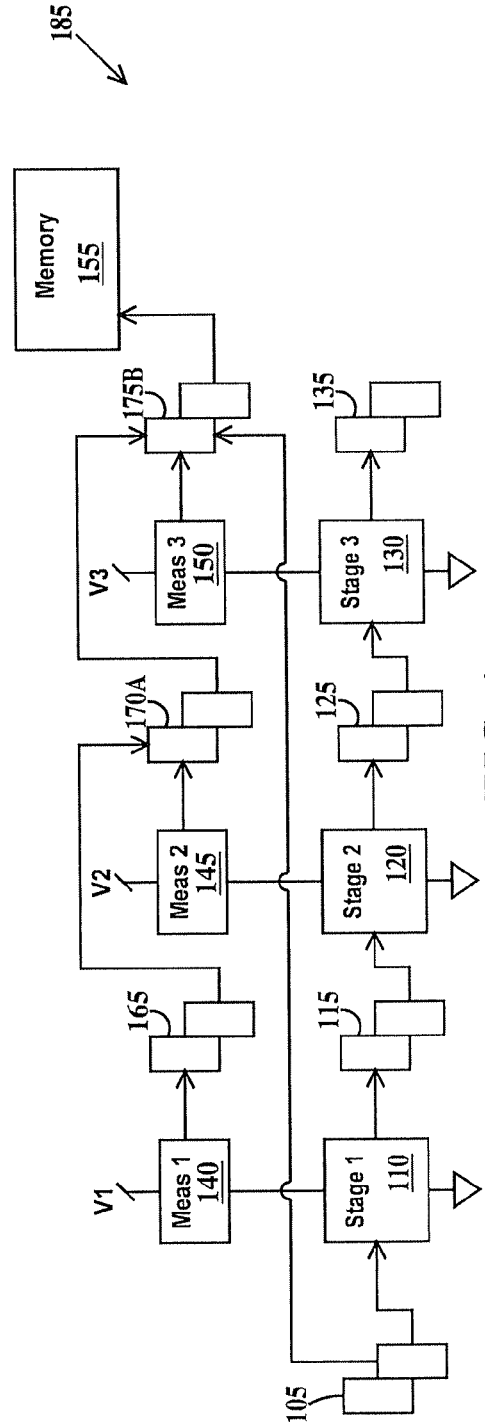
FIG. 4 is an exemplary circuit diagram of an integrated circuit according to a fourth embodiment the present invention.

FIG. 4 is an exemplary circuit diagram of an integrated circuit according to a fourth embodiment the present invention. In FIG. 4, an integrated circuit 185 is similar to integrated circuit 180 of FIG. 3 except latch 175B replaces latch 175A and the output of latch 105 is connected to latch 175A instead of memory element 155. Latch 175B includes logic to add the power measurement data from latch 170A to the power measurement data from measurement circuit 150 and store the sum. Latch 175B also includes storage elements to store the data presented to latch 105 and pass that data along with the summed power data to memory 155. The Tags are the same as those illustrated in TABLE II.

Turning to FIG. 8, FIG. 8 is a flowchart of a fourth method according to the embodiments of the present invention. Steps 285, 305 and 100 are performed for each new process data entering process stage 1. Steps 290, 295 and 300 are performed for each processing stage independently. In step 285, a tag ID is created. In step 290, power consumption is measure and in step 295 power data is generated. In step 300, for the second and third stages, the power data from the previous processing stage is added to the power data from the current processing stage. In step 305, the power data attached to the process data and in step 310, the combined power and process data is stored in memory. The sequence that steps 285, 290, 295, 300, 305 and 315 are performed in may vary depending upon the actual circuit implementation except steps 295 and 300 are performed before step 305 and step 305 is performed before step 310.

Figure 9:
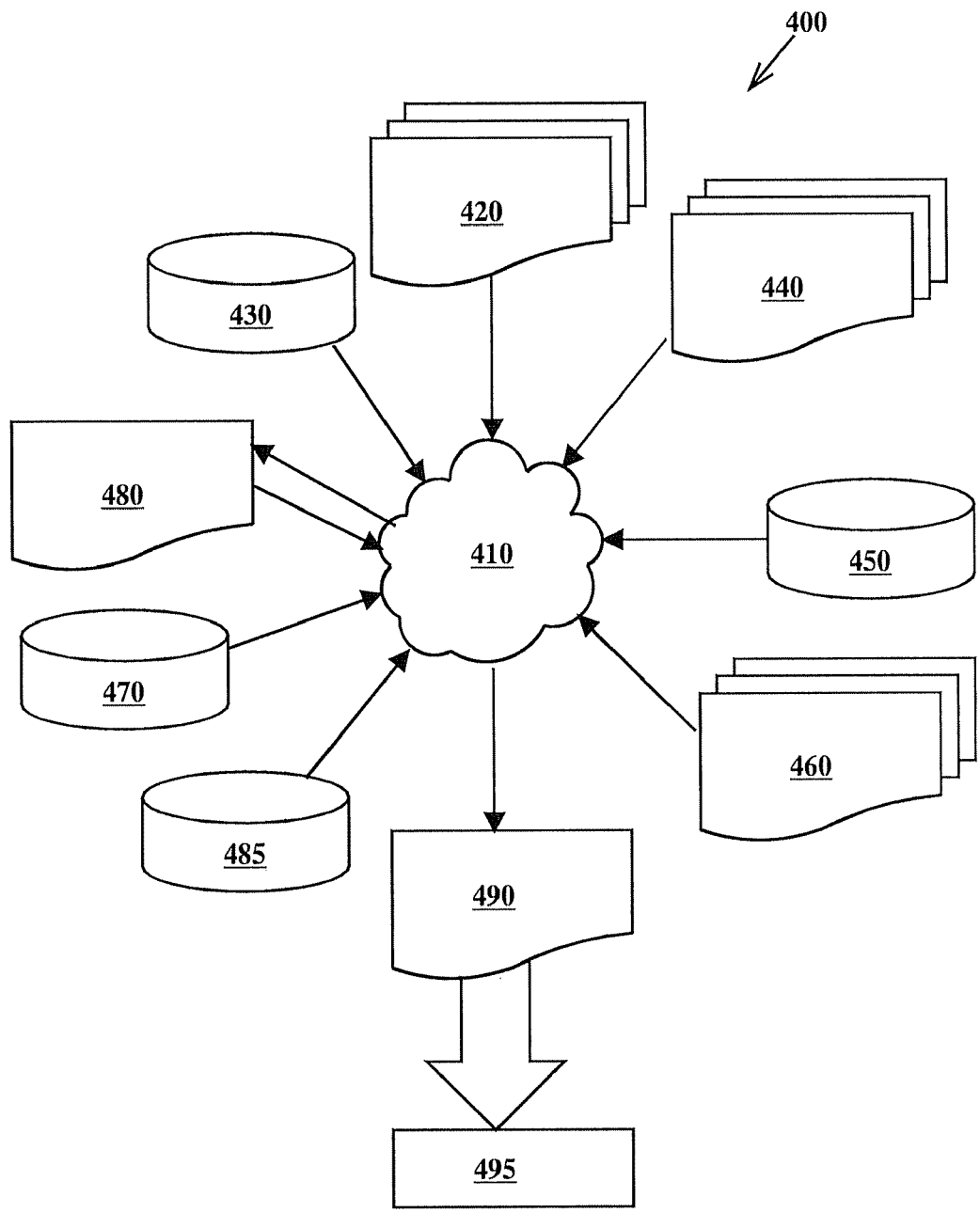
FIG. 9 shows a block diagram of an exemplary design flow 400 used for example, in semiconductor design, manufacturing, and/or test.

FIG. 9 shows a block diagram of an exemplary design flow 400 used for example, in semiconductor design, manufacturing, and/or test. Design flow 400 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 comprises an embodiment of the invention as shown in FIGS. 1, 2, 3 and 4 in the form of schematics or HDL, a hardware-description language (e.g., Verilog, VHDL, C, etc.). Design structure 420 may be contained on one or more machine readable medium. For example, design structure 420 may be a text file or a graphical representation of an embodiment of the invention as shown in FIGS. 1, 2, 3 and 4. Design process 410 preferably synthesizes (or translates) an embodiment of the invention as shown in FIGS. 1, 2, 3 and 4 into a netlist 480, where netlist 480 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 480 is resynthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 40 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the invention. The design structure of the invention is not limited to any specific design flow.

Design process 410 preferably translates an embodiment of the invention as shown in FIGS. 1, 2, 3 and 4, along with any additional integrated circuit design or data (if applicable), into a second design structure 490. Design structure 490 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 490 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 3 and 4. Design structure 490 may then proceed to a stage 495 where, for example, design structure 490: proceeds to tape-out, is released to manufacturing, is released to a mask house, is sent to another design house, is sent back to the customer, etc.

Thus the present invention provides circuits designs, circuits, methods and design structures for determining data dependent power consumption of integrated circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure embodied in a machine readable medium, the design structure comprising:
    a data processing circuit having an input and an output, said data processing circuit configured to generate an output data signal on said output based on an input data signal presented to said input;
    a power measurement circuit configured to measure an amount of electrical power consumed by said processing circuit in generating said output signal from said input signal, said power measurement circuit connected between said processing circuit and a power supply for said processing circuit; and
    a memory element configured to store a tag containing a value representing said amount of electrical power consumed by said processing circuit in generating said output data signal from said input data signal and either (a) said input data of said input data signal or (b) a pointer to said input data of said input data signal.

2. The design structure of claim 1, wherein said processing circuit includes one or more circuits selected from the group consisting of AND gates, OR gates, NAND gates, NOR gates and multiplexers.

3. The design structure of claim 1, wherein said processing circuit is contained within a voltage island.

4. The design structure of claim 1, wherein said input data is digital data.

5. The design structure of claim 1, wherein said power measurement circuit measures, (i) a voltage drop in a shunt between said power supply and said processing circuit, (ii) a current draw of said processing circuit or (iii) both a voltage applied to and a current consumed by said processing circuit.

6. The design structure of claim 1, wherein said processing circuit comprises two or more logically and electrically connected stages and said power measurement circuit comprises two or more power measurement sub-circuits, each of said two or more power measurement sub-circuits connected to a respective processing stage.

7. The design structure of claim 6, wherein at least two of said two or more stages are contained in respective voltage islands.

8. The design structure of claim 6, further including:
    means to create and store a tag for each stage of said processing circuit, each tag including (i) specific input data to a given stage or a pointer to the specific input data, (ii) power consumed by the given stage in processing said specific input data and (iii) a stage identifier, wherein for said first stage of said two or more stages said specific input data is said input data of said input data signal and for all subsequent stages of said two or more stages said specific input data is data outputted from an immediately previous stage.

9. The design structure of claim 6, further including:
    wherein said value representing said amount of electrical power consumed by said processing circuit is a sum of power consumed by each stage of said processing circuit in processing a data stream of said input data signal.

10. The design structure of claim 1, wherein the design structure comprises a netlist.

11. The design structure of claim 1, wherein the design structure resides on storage medium as a data format used for the exchange of layout data of integrated circuits.

* * * * *